United States Patent
Tortorelli et al.

(10) Patent No.: US 11,923,002 B2
(45) Date of Patent: Mar. 5, 2024

(54) VARYING-POLARITY READ OPERATIONS FOR POLARITY-WRITTEN MEMORY CELLS

(71) Applicant: Micron Technology, Inc., Boise, ID (US)

(72) Inventors: Innocenzo Tortorelli, Cernusco Sul Naviglio (IT); Hari Giduturi, Folsom, CA (US); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/869,649

(22) Filed: Jul. 20, 2022

(65) Prior Publication Data

US 2022/0359005 A1   Nov. 10, 2022

Related U.S. Application Data

(62) Division of application No. 16/797,432, filed on Feb. 21, 2020, now Pat. No. 11,430,509.

(51) Int. Cl.
   *G11C 7/00*       (2006.01)
   *G11C 11/4074*    (2006.01)
   (Continued)

(52) U.S. Cl.
   CPC ...... *G11C 11/5642* (2013.01); *G11C 11/4074* (2013.01); *G11C 11/409* (2013.01); *G11C 11/5628* (2013.01); *G11C 29/50004* (2013.01)

(58) Field of Classification Search
   CPC .................................................. G11C 11/5642
   (Continued)

(56) References Cited

U.S. PATENT DOCUMENTS

| | | | |
|---|---|---|---|
| 9,799,381 | B1 | 10/2017 | Tortorelli et al. |
| 10,102,891 | B2 | 10/2018 | Tortorelli et al. |

(Continued)

FOREIGN PATENT DOCUMENTS

| | | |
|---|---|---|
| CN | 109074842 A | 12/2018 |
| JP | 2006-190376 A | 7/2006 |

(Continued)

OTHER PUBLICATIONS

International Search Report and Written Opinion received for PCT Patent Application No. PCT/US21/16630, dated May 25, 2021, 8 pages.

(Continued)

*Primary Examiner* — Hoai V Ho
(74) *Attorney, Agent, or Firm* — Holland & Hart LLP

(57) ABSTRACT

Methods, systems, and devices for varying-polarity read operations for polarity-written memory cells are described. Memory cells may be programmed to store different logic values based on applying write voltages of different polarities to the memory cells. A memory device may read the logic values based on applying read voltages to the memory cells, and the polarity of the read voltages may vary such that at least some read voltages have one polarity and at least some read voltages have another polarity. The read voltage polarity may vary randomly or according to a pattern and may be controlled by the memory device or by a host device for the memory device.

18 Claims, 9 Drawing Sheets

(51) Int. Cl.
 *G11C 11/409* (2006.01)
 *G11C 11/56* (2006.01)
 *G11C 29/50* (2006.01)

(58) Field of Classification Search
 USPC .......................................................... 365/205
 See application file for complete search history.

(56) References Cited

U.S. PATENT DOCUMENTS

| | | |
|---|---|---|
| 2008/0310218 A1 | 12/2008 | Hachino |
| 2011/0096611 A1 | 4/2011 | Lee et al. |
| 2014/0126315 A1* | 5/2014 | Roy .......................... G11C 7/08 365/207 |
| 2016/0111150 A1 | 4/2016 | Bazarsky et al. |
| 2016/0180911 A1 | 6/2016 | Schneider et al. |
| 2017/0154674 A1 | 6/2017 | Huang |
| 2018/0102149 A1 | 4/2018 | Tortorelli et al. |
| 2018/0315474 A1 | 11/2018 | Redaelli et al. |
| 2019/0206489 A1 | 7/2019 | Wang et al. |

FOREIGN PATENT DOCUMENTS

| | | |
|---|---|---|
| JP | 2014-529838 A | 11/2014 |
| JP | 2017-102993 A | 6/2017 |
| JP | 2019-502224 A | 1/2019 |

OTHER PUBLICATIONS

Taiwan Intellectual Property Office, "Office Action," issued in connection with ROC (Taiwan) Patent Application No. 110102066, dated Sep. 22, 2021 (4 pages).

Japan Patent Office, "Office Action," issued in connection with Japan Patent Application No. 2022-549775 dated Oct. 3, 2023 (12 pages total; 6 pages Original & 6 pages machine translation).

* cited by examiner

VARYING-POLARITY READ OPERATIONS FOR POLARITY-WRITTEN MEMORY CELLS

CROSS REFERENCE

The present Application for Patent is a divisional of U.S. patent application Ser. No. 16/797,432 by Tortorelli, et al., entitled "VARYING-POLARITY READ OPERATIONS FOR POLARITY-WRITTEN MEMORY CELLS", filed Feb. 21, 2020, assigned to the assignee hereof, and is expressly incorporated by reference in its entirety herein.

BACKGROUND

The following relates generally to one or more memory systems and more specifically to varying-polarity read operations for polarity-written memory cells.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
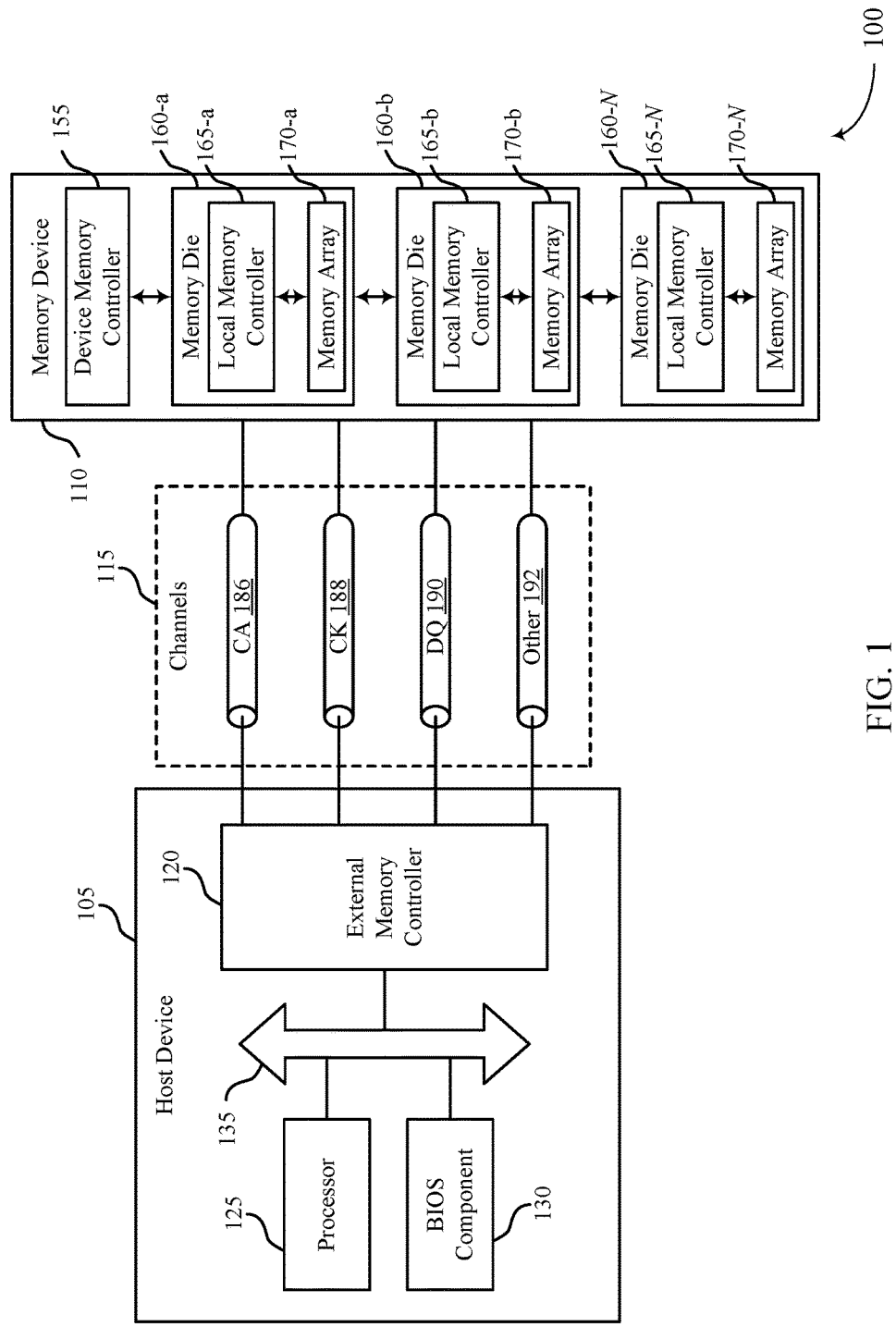
FIG. 1 illustrates an example of a system that supports varying-polarity read operations for polarity-written memory cells in accordance with examples as disclosed herein.

For some memory cells, the logic value stored by a memory cell may depend at least in part on the polarity of a voltage previously used to write (program) the memory cell. Such memory cells may be referred to as polarity-written or polarity-programmed memory cells. For example, some memory cells, such as some chalcogenide-based memory cells, may have a threshold voltage at which they become conductive (i.e., they switch on to allow current flow, or at least to have a resistance below a threshold value), and the threshold voltage of such a memory cell (e.g., as observed, sensed, or otherwise determined by a sense component) may depend on the polarity of the voltage most recently used to write the memory cell. Voltages applied to (e.g., across) memory cells to write the memory cells may be referred to as write voltages, and in some cases may be applied as voltage pulses referred to as write pulses.

As one illustrative example, applying a write voltage with a positive polarity to a memory cell may result in the memory cell having a relatively high threshold voltage, which may be associated with a first logic value (e.g., logic 1), and applying a write voltage with a negative polarity to the memory cell may result in the memory cell having a relatively low threshold voltage, which may be associated with a second logic value (e.g., logic 0). It is to be understood that any assignments of positive and negative to different polarities and of particular logic values to any different physical states of a memory cell in this and other examples herein are non-limiting and may be altered without deviating from the teachings herein.

To read a memory cell, a read voltage may be applied to the memory cell (e.g., as a voltage pulse, which may be referred to as a read pulse), and the presence or absence of a current through the memory cell (e.g., above a threshold amount, or the presence or absence of a snapback event) in response to the read voltage (e.g., while the read voltage is applied) may be used (e.g., sensed) to determine the logic value previously written to and thus stored by the memory cell. The read voltage may have a magnitude (e.g., amplitude) in between the relatively low threshold voltage and the relatively high threshold voltage associated with the different logic values, such that the memory cell will become conductive in response to the read voltage only if in the low threshold voltage state, and the difference between the relatively low threshold voltage and the relatively high threshold voltage may be referred to as a read window.

In some cases, an observed (e.g., sensed) threshold voltage for a memory cell may depend on a relationship between the polarity of the read voltage and the polarity of the operative (e.g., most recent) write voltage for the memory cell. For example, a memory cell may be sensed as having a high threshold voltage if the operative write polarity was different than the read polarity, and the memory cell may be sensed as having a low threshold voltage if the operative write polarity was the same as the read polarity. Thus, if a negative polarity read voltage is used, for example, then a positive polarity write voltage may be associated with a high threshold voltage and a corresponding logic value (e.g., logic 1), and a negative polarity write voltage may be associated with a low threshold voltage and a corresponding logic value (e.g., logic 0), as in the above example. In some cases, a high threshold voltage state may alternatively be referred to as a set state, and a low threshold voltage state may alternatively be referred to as a reset state.

In some cases, the absolute value of the threshold voltage of memory cells programmed into at least one state may change over time, which may be referred to as drift. For example, the threshold voltage of memory cells programmed into the high threshold voltage state may tend to drift downwards over time, raising a risk of errors when reading such memory cells (e.g., reading such a memory cell as having a low threshold voltage despite the memory cell having been previously programmed to have a high threshold voltage). In some cases, the threshold voltages of memory cells in all states may drift in one direction or another, but memory cells programmed into a high threshold voltage state may drift at a faster rate than memory cells programmed into a low threshold voltage state. Memory cells that have a higher tendency or rate of voltage drift may limit the usefulness and performance of devices employing those memory cells.

In some cases, as a memory array is operated, various sub-threshold voltages may be applied to a memory cell in between the memory cell being written and read. A sub-threshold voltage may be below the threshold voltage of a memory cell (e.g., smaller in magnitude than a write voltage) but may nevertheless "soft-program" a memory cell by causing the threshold voltage of the memory cell to drift towards the state associated with the polarity of the sub-threshold voltage. As one example, in some memory architectures, a memory cell in a memory array may experience a sub-threshold voltage when another memory cell in the memory array is written or read. Drift caused by write or read voltages applied to other memory cells may in some cases be referred to as bias drift. As another example, when a memory cell is read, if the memory cell is in the high threshold voltage state, the read voltage may be an example of a sub-threshold voltage applied to the memory cell. Drift caused by read voltages applied to a memory cell may in some cases may be referred to as read disturb.

In some cases, for polarity-written memory cells, if read pulses are repeatedly (e.g., consecutively) applied with the same polarity, memory cells previously written using write pulses of opposite polarity as the read pulses may drift towards the state associated with the read pulse polarity. In such cases, the size of a read window may decrease, and even unintended changes to previously written logic values may occur. Changes to memory cell status (e.g., state) due to the bias drift, read disturb, or other analogous mechanisms may decrease the overall performance and efficiency of the memory device.

In accordance with the teachings herein, the polarity of the read voltages may be varied so as to sometimes use positive polarity read voltages and other times use negative polarity voltages. In some examples, varying the polarity of the read voltages may avoid soft-programming the memory cell into one of the two states (e.g., programming the memory cell to the state associated with a given polarity). In some cases, the polarity of the read pulse may be varied based on a random determination or a pattern (e.g., alternating). For example, the polarity of the read pulses may be varied such that some are one polarity (e.g., positive) and some are another polarity (e.g., negative). Variation of read pulse polarity can be controlled by the memory device or the host device (e.g., based on the host device issuing polarity-specific read commands or otherwise indicating read polarities). For one polarity of read pulse, sensed logic values can be directly output, and for another polarity of read pulse, sensed logic values can be inverted to counteract the impact of using read pulses of different polarities.

Such techniques as described herein may mitigate the effects of voltage drift and read disturb, along with other benefits that may be appreciated by one of ordinary skill in the art, by avoiding consecutive or otherwise repeated sub-threshold voltages of the same polarity across the same memory cell. For example, bit error rates may be decreased or performance of the memory device may otherwise be improved. Further, in some cases, complexities associated with other techniques for mitigate the effects of voltage drift and read disturb (e.g., adjusting the magnitude of read voltages based on elapsed time since the operative write voltage) may be beneficially reduced or avoided entirely.

Features of the disclosure are initially described in the context of memory systems, dies, and cells as described with reference to FIGS. 1-3. Features of the disclosure are described in the context of a timing diagram and block diagram as described with reference to FIGS. 4 and 5. These and other features of the disclosure are further illustrated by and described with reference to an apparatus diagram and flowcharts that relate to varying-polarity read operations for polarity-written memory cells as described with references to FIGS. 6-9.

FIG. 1 illustrates an example of a system 100 that supports varying-polarity read operations for polarity-written memory cells in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

In some cases, the host device 105 may control the polarity of read voltages used by the memory device 110. For example, the host device 105 may control the polarity of read voltages by issuing different types of read commands, such as a first command to read memory cells using a first polarity read voltage (e.g., read positive command) and a second command to read memory cells using a second polarity read voltage (e.g., read negative command). In some such cases, each read command include or otherwise be associated with an indication of the polarity of the one or more associated read voltages. The host device 105 may randomize the polarities of the read voltages or vary the polarities of the read voltages according to some pattern (e.g., alternating).

In some cases, the memory device 110 (e.g., a controller within the memory device 110) may control the polarity of the read voltages. For example, the memory device 110 may control the read voltage polarity where the polarity of the read pulse is random. In such cases, the memory device 110 may determine to use a given polarity for a read voltage based on a random determination. In other examples, the memory device 110 may control the read voltage polarity where the polarity of the read voltage is not random. In such cases, the memory device 110 may determine to use a given polarity for a read voltage based on a polarity of a prior read voltage (e.g., according to some pattern, such as an alternating pattern, where a next read voltage polarity is the thus determined based on the pattern and one or more prior read voltage polarities).

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
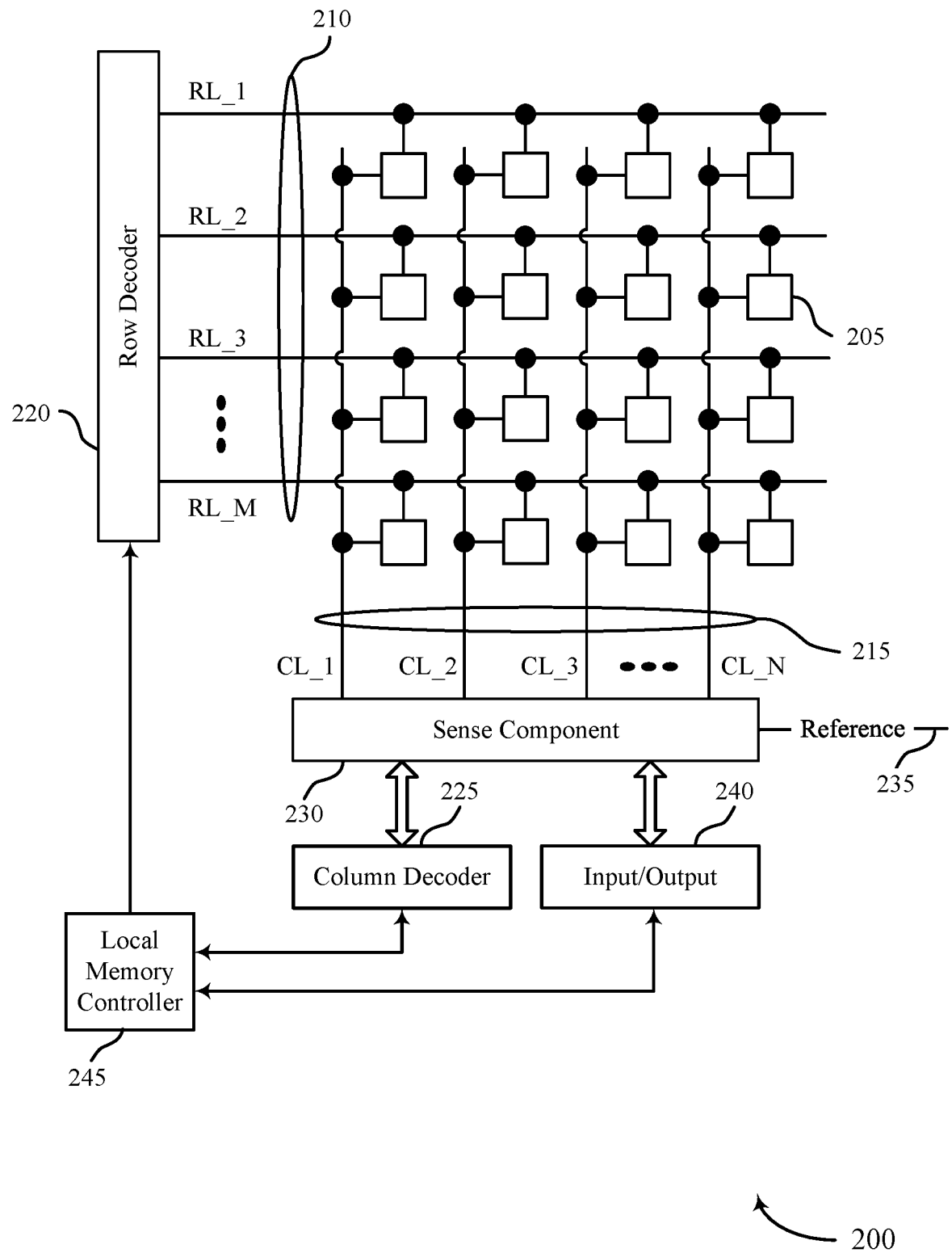
FIG. 2 illustrates an example of a memory die that supports varying-polarity read operations for polarity-written memory cells in accordance with examples as disclosed herein.

FIG. 2 illustrates an example of a memory die 200 that supports varying-polarity read operations for polarity-written memory cells in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic values (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic value using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. In some cases, the configurable material may exhibit different threshold voltages based on the polarity of a voltage (e.g., a write voltage) previously applied to the configurable material (e.g., applied to the memory cell 205 that includes the configurable material). In some cases, the threshold voltage exhibited by the configurable material may be further based on the polarity of a read voltage used to sense the threshold voltage (e.g., whether the read voltage has the same or different polarity as a previously applied write voltage).

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215 so as to apply desired voltages to the memory cells 205. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold voltage state) of a memory cell 205 and determine a logic value of the memory cell 205 based on the detected state. The sense component 230 may include one or more sense amplifiers to amplify or otherwise convert a signal resulting from accessing the memory cell 205. The sense component 230 may compare a signal detected from the memory cell 205 to a reference signal 235 (e.g., a reference voltage). The detected logic value of the memory cell 205 may be provided as an output of the sense component 230 (e.g., to an input/output 240), and may indicate the detected logic value to another component of a memory device that includes the memory die 200. In some cases, the sense component 230 may be located between the memory cells 205 and the column decoder 225 as shown in the example of FIG. 2. In other cases, the column decoder 225 may be located between the memory cells 205 of the memory array and the sense component 230. Further, the sense component 230 may in some cases include fewer sense amplifiers than the memory array includes column lines 215, which may in some such cases be supported by the column decoder 225 being located between the memory cells 205 of the memory array and the sense component 230.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some cases, access commands associated with the access operations may be received from a host device (not shown) and executed by the memory device on the memory array. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic value. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 (e.g., through control of the row decoder 220 and column decoder 225) may cause the target row line 210 and the target column line 215 to have specific voltages and thereby apply a specific signal (e.g., write pulse or other write voltage of a desired polarity) to the memory cell 205 during the write operation to store a specific state in the storage element of the memory cell 205. A pulse used as part of the write operation may include one or more voltage levels over a duration.

The local memory controller 260 may also be operable to perform a read operation (e.g., a sense operation) on one or more memory cells 205 of the memory die 200. During a read operation, the logic value stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 (e.g., through control of the row decoder 220 and column decoder 225) may cause the target row line 210 and the target column line 215 to have specific voltages and thereby apply a specific signal (e.g., read pulse or other read voltage of a desired polarity) to the memory cell 205. The sense component 230 may detect a signal received from the memory cell 205 that is based on the read voltage applied to the memory cell 205, such as a signal indicative of a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference signal 235. Based on that comparison or otherwise, the sense component 230 may determine a logic value that is stored by the memory cell 205. A pulse used as part of the read operation may include one or more voltage levels over a duration.

A read voltage as part of the read operation may be referred to as a demarcation voltage. In some cases, in response to application of the read voltage, the memory cell 205 may snap (e.g., exhibit a negative resistance by having a current through the memory cell 205 increase while a voltage across the memory cell 205 decreases, which may also be referred to as exhibiting or undergoing a snapback event) if the memory cell 205 is at a low threshold voltage, and the memory cell 205 may refrain from snapping if the memory cell 205 is at a high threshold voltage.

The memory system that includes the memory die 200 may vary the polarity of the read voltage to avoid soft-programing or otherwise causing memory cells 205 to undesirably drift towards or into any particular state (e.g., a threshold voltage associated with a particular polarity of a write voltage). The variation of the read voltage polarity may be random or according to some predefined pattern (e.g., alternating so as to flip the read polarity for every read pulse). Varying (e.g., flipping) the read polarity may have various benefits. For example, the time-based drift of threshold voltage distributions for memory cells programmed to store one or more logic values may decrease (e.g., be eliminated). Additionally or alternatively, read windows may be increased and overall performance of the memory system may be improved. Additionally or alternatively, a single read voltage magnitude may be used (e.g., instead of using two or more different magnitudes of read voltages to account for the drift of threshold voltages over time), which provide complexity- or cost-related benefits, for example.

Figure 3:
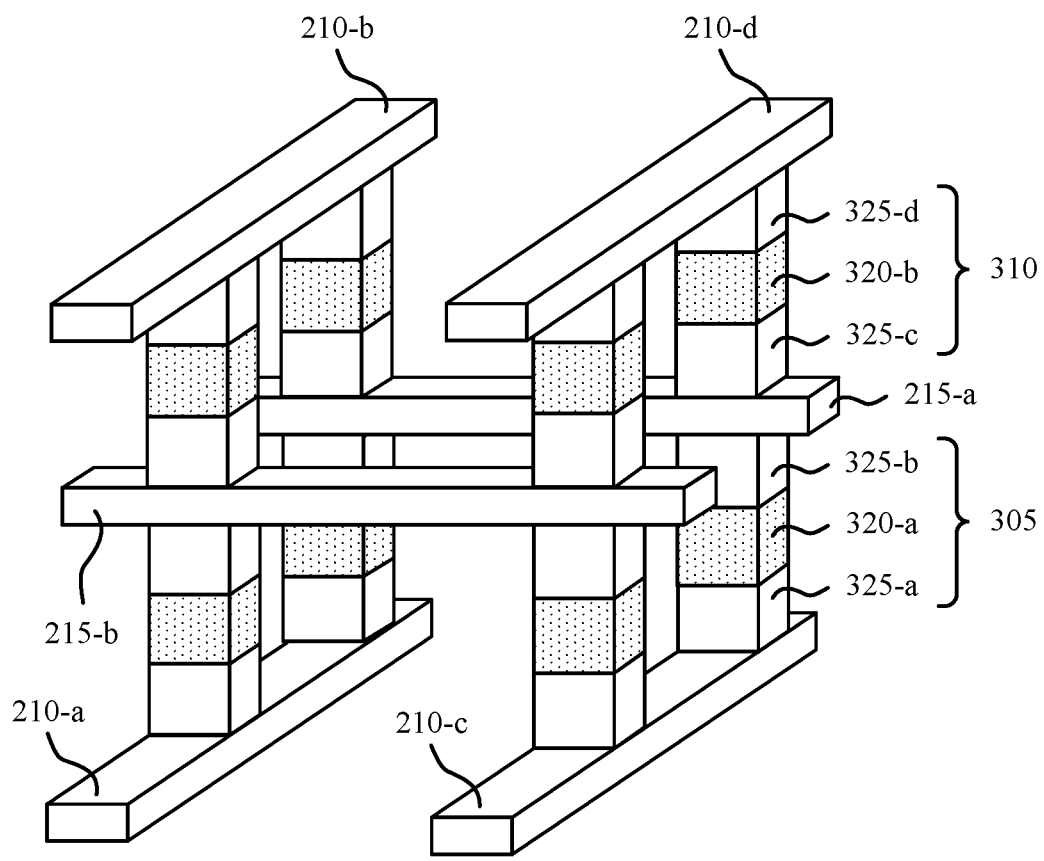
FIG. 3 illustrates an example of a memory array that support varying-polarity read operations for polarity-written memory cells in accordance with examples as disclosed herein.

FIG. 3 illustrates an example of a memory array 300 that supports varying-polarity read operations for polarity-written memory cells in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-$a$, a row line 210-$b$, a row line 210-$c$, a row line 210-$d$, a column line 215-$a$, and a column line 215-$b$, which may be examples of row lines 210 and column lines 215, as described with reference to FIG. 2. Memory cells of the first deck 305 and the second deck 310 may each include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled though they are the same or would be understood to be similar, in an effort to increase visibility and clarity of the depicted features.

A memory cell of the first deck 305 may include one or more of an electrode 325-$a$, a storage element 320-$a$, or an electrode 325-$b$. A memory cell of the second deck 310 may include an electrode 325-$c$, a storage element 320-$b$, and an electrode 325-$d$. The storage elements 320 may be examples of a configurable (e.g., chalcogenide) material, such as a phase change storage element or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-$c$ of the second deck 310 and the second electrode 325-$b$ of the first deck 305 may be coupled with column line 215-$a$ such that the column line 215-$a$ may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, such as for thresholding memory cells or self-selecting memory cells, some or all of the set of states (e.g., discernable threshold voltages or threshold voltage ranges) and associated logic values supported by the memory cells of the memory array 300 may be associated with an amorphous state of the storage element 320 In such examples, the material used in the storage element 320 may be an alloy (such as the alloys listed above) and may be operated so as to not undergo a phase change (e.g., may not undergo a change between a relatively crystalline state and a relatively amorphous state) during normal operation of the memory cell. For example, the material of the storage element 320 may be a chalcogenide material that includes a chemical element, such as arsenic, that inhibits the chalcogenide material from changing states.

During a programming (write) operation of a memory cell of the memory array 300, a polarity used for a write operation may influence (determine, set, program) a particular behavior or characteristic of the material of the storage element 320 of the memory cell, such as the threshold voltage of the material. The difference in threshold voltages of the material of the storage element 320 depending on the logic value stored by the material of the storage element 320 (e.g., the difference between the threshold voltage when the material is storing a logic 0 versus a logic 1) may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to at least some other architectures. For example, the architecture may have a 4F2 memory cell area, where F is the smallest feature size, compared to other architectures with a 6F2 memory cell area, such as those with a three-terminal selector element.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In a cross-point architecture, reading or writing various memory cells may result in other memory cells in the memory array 300 having a voltage placed across them because of the common row lines 210 and column lines 215. For example, a subthreshold voltage may be placed across non-target memory cells that may influence the threshold voltage of the non-target memory cells. In some cases, when reading a memory cell, if a read voltage is applied between the threshold voltages for the two logic values, the state of the memory cell may be impacted (e.g., caused to drift) towards the threshold voltage associated with a write voltage of the same polarity as the read voltage. To mitigate these and other effects, the polarity of the read pulses used to read memory cells of the memory array 300 may be varied. For example, the polarity of the read pulses may be varied by the host device or by the memory device. Further, the polarity of the read pulses may be varied randomly or according to a pattern. In such cases, the influence of read pulses of a first polarity (e.g., soft writes with the first polarity) applied to memory cells of the memory array 300 may be canceled or mitigated by read pulses of a second polarity (e.g., refreshes with the second polarity).

Figure 4:
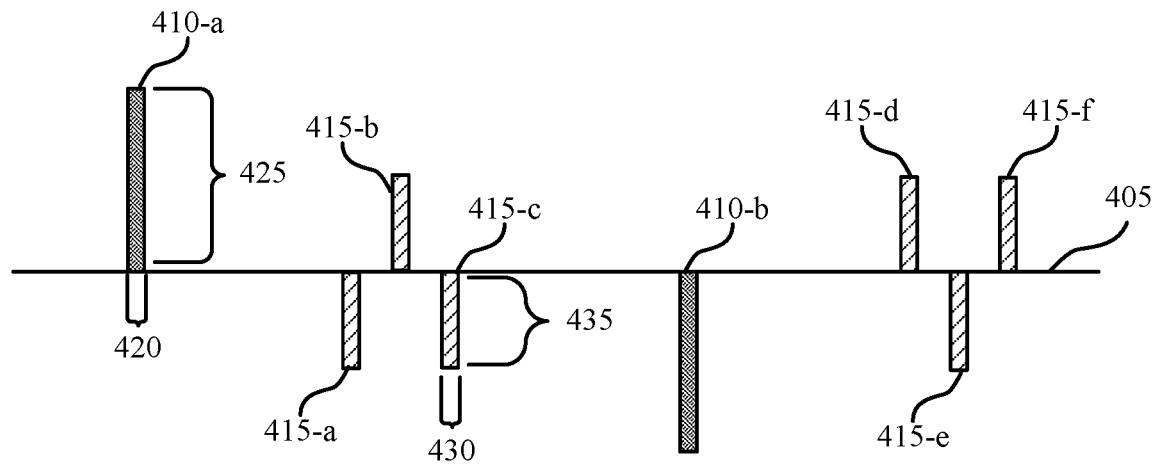
FIG. 4 illustrates an example of a timing diagram that supports varying-polarity read operations for polarity-written memory cells in accordance with examples as disclosed herein.

FIG. 4 illustrates an example of a timing diagram 400 that supports varying-polarity read operations for polarity-written memory cells in accordance with examples as disclosed herein. Timing diagram 400 includes examples of write pulses 410 and read pulses 415 that may be applied to a same memory cell. Each write pulse 410 may have a respective duration 420 and respective magnitude 425. Each read pulse 415 may have a respective duration 430 and a respective magnitude 435. In some examples, read pulses 415-*a*, 415-*c*, and 415-*e* may be an example of a first subset of read pulses 415 each having a same (e.g., negative) polarity and read pulses 415-*b*, 415-*d*, and 415-*f* may be an example of a second subset of read pulses 415 each having a same (e.g., positive) polarity.

The memory device may receive write commands associated with various logic values, and in response to each write command, the memory device may apply a corresponding write pulse to write (store, program) the associated logic value to the memory cell. The polarity of the corresponding write pulse may be based on the associated logic value (e.g., a positive write pulse polarity may be used to write a logic 1, and a negative write pulse polarity may be used to write a logic 0). Once any logic value is stored by a memory cell, the logic value may be determined using a read pulse 415 of either polarity. A write pulse 410 or a read pulse 415 may be an example of a voltage pulse and may alternatively be considered a write voltage or a read voltage.

Thus, as one illustrative example of a sequence of write and read commands and associated write and read pulses, the memory device may receive a first write command associated with a first logic value for a memory cell. In response to the first write command, the memory device may apply a write pulse 410-*a* (e.g., write voltage) having a first polarity to the memory cell. For example, the write pulse 410-*a* may have a positive polarity. The memory cell may store the first logic value based on the polarity of the write pulse 410-*a*. For example, based on the positive polarity of the write pulse 410-*a*, the memory cell may be sensed as having a high threshold voltage if subsequently sensed using a read pulse having a negative (different) polarity and as having a low threshold voltage if subsequently sensed using a read pulse having a positive (same) polarity.

At some time after receiving the first write command, the memory device may receive a first read command for the memory cell. In response to the first read command, the memory device may apply read pulse 415-*a*. The polarity of the read pulse 415-*a* may be negative, and thus the memory cell may be sensed as having a high threshold voltage.

At some time after receiving the first read command, the memory device may receive a second read command for the memory cell. In response to the second read command, the memory device may apply read pulse 415-*b*. Read pulse 415-*b* may have a positive polarity, and thus the memory cell may be sensed as having a low threshold voltage.

At some time after receiving the second read command, the memory device may receive a third read command for the memory cell. In response to the third read command, the memory device may apply read pulse 415-*c*. The polarity of the read pulse 415-*c* may be negative, and thus the memory cell may be sensed as having a high threshold voltage.

At some time after receiving the third read command, the memory device may receive a second write command associated with a second logic value for the memory cell. In response to the second write command, the memory device may apply a write pulse 410-*b* (e.g., write voltage) having a second polarity to the memory cell. For example, the write pulse 410-*b* may have a negative polarity. The memory cell may store the second logic value based on the polarity of the write pulse 410-*b*. For example, based on the negative polarity of the write pulse 410-*b*, the memory cell may be sensed as having a low threshold voltage if subsequently sensed using a read pulse having a negative (same) polarity and as having a high threshold voltage if subsequently sensed using a read pulse having a positive (different) polarity.

At some time after receiving the second write command, the memory device may receive a fourth read command for the memory cell. In response to the fourth read command, the memory device may apply the read pulse 415-*d*. The polarity of the read pulse 415-*d* may be positive, and thus the memory cell may be sensed as having a high threshold voltage.

At some time after receiving the fourth read command, the memory device may receive a fifth read command for the memory cell. In response to the fifth read command, the memory device may apply read pulse 415-*e* having a negative polarity, and thus the memory cell may be sensed as having a low threshold voltage.

At some time after receiving the fifth read command, the memory device may receive a sixth read command for the memory cell. In response to the sixth read command, the memory device may apply read pulse 415-*f* having a positive polarity, and thus the memory cell may be sensed as having a high threshold voltage.

In some examples, to support sensing a logic state associated with a write pulse 410 of any polarity using a read pulse 415 of any polarity, then one polarity of read pulse may be defined as the "default" read polarity and another polarity of read pulse may be defined as the "alternative" or "inverted" read polarity. The memory device may sense a logic value for a memory cell based on whether the magnitude 435 of a read pulse 415 exceeds the threshold voltage of the memory cell—for example, the memory device may determine whether an amount of current beyond a threshold amount flows through the memory cell while the read pulse 415 is applied, whether a resistance of the memory cell is below a threshold resistance while the read pulse 415 is applied, whether the memory cell exhibits a snapback event while the read pulse 415 is applied, or any combination thereof.

The memory cell may determine and output an indication of a stored logic value based on the sensed logic value and the polarity of the read pulse 415 used to sense (detect, determine, obtain) the sensed logic value. For example, if a read pulse 415 is the default read polarity, then the stored logic value may be determined to be equal to the sensed logic value associated with the read pulse 415, and if a read pulse 415 is the alternative read polarity, then the stored logic value may be determined to be equal to the inverse (or some other mapping or conversion) of sensed logic value associated with the read pulse 415.

In the example of FIG. 4, a negative read polarity may be defined as the default read polarity, and the positive read polarity may be defined as the alternative read polarity. Further, a high threshold voltage of the memory cell may be defined as a logic 1, and a low threshold voltage of the memory cell may be defined as a logic 0. Accordingly, because a high threshold voltage may be sensed when a read pulse 415 is the opposite polarity as a preceding write pulse 410, then—where the default read polarity is negative—a positive write pulse 410 may be used to write a logic 1, and a negative write pulse 410 may be used to write a logic 0.

Thus, for example, due to the positive polarity of the write pulse 410-*a*, in response to subsequently applying a negative read pulse 415 (e.g., read pulse 415-*a* or read pulse 415-*c*), the memory device may determine that the memory cell has a high threshold voltage, and thus the sensed logic value may be a logic 1, and the stored logic value may also be determined to be a logic 1 due to the default read polarity having been used. And in response to subsequently applying a positive read pulse 415 (e.g., read pulse 415-*b*), the memory device may determine that the memory cell has a low threshold voltage, and thus the sensed logic value may be a logic 0, but the stored logic value may be determined to be a logic 1 due to the alternative read polarity having been used.

Similarly, for example, due to the negative polarity of the write pulse 410-*b*, in response to subsequently applying a negative read pulse 415 (e.g., read pulse 415-*e*), the memory device may determine that the memory cell has a low threshold voltage, and thus the sensed logic value may be a logic 0, and the stored logic value may also be determined to be a logic 0 due to the default read polarity having been used. And in response to subsequently applying a positive read pulse 415 (e.g., read pulse 415-*d* or read pulse 415-*f*), the memory device may determine that the memory cell has a high threshold voltage, and thus the sensed logic value may be a logic 1, but the stored logic value may be determined to be a logic 0 due to the alternative read polarity having been used.

Thus, the logic state stored by a memory cell (e.g., the polarity of an operative write pulse 410) may be determined based on a threshold voltage of the memory cell (which may correspond to a sensed logic state) and on a polarity of a read pulse used to determine the threshold voltage. Further, the memory cell may be read using read pulses 415 of either polarity, regardless of the state stored by the memory cell (e.g., the polarity of the operative write pulse 410).

Timing diagram 400 shows an illustrative example in which each read pulse 415 has the same magnitude 435 and duration 430, and in which each write pulse 410 has the same magnitude 425 and duration 420. In some cases, however, read pulses 415 of different polarities may have different magnitudes 435 (e.g., to account for asymmetries in cell behavior). Additionally or alternatively, write pulses 410 of different polarities may have different magnitudes 435 (e.g., to account for asymmetries in cell behavior). In some cases, each read pulse 415 may have a magnitude that is greater than a low threshold voltage corresponding to one logic value and less than a high threshold voltage corresponding to another logic value, at least as sensed using the polarity of a given read pulse 415. Further, in some cases, a write pulse 410 may have a magnitude 425 that is greater than the high threshold voltage, at least from the perspective of the polarity of the write pulse 410, so as to be able to overwrite a previously stored logic state in cases it is different than the one associated with the write pulse 410. Thus, write pulses 410 may each have a magnitude 425 greater than the magnitude 435 of any read pulses 415, or at least greater than the magnitude 435 of any read pulses 415 of a same polarity as a given write pulse 410.

In some cases, the duration 420 of each write pulse 410 may be the same as the duration 430 of each read pulse 415. In some cases, the duration 420 of the write pulses may be different than the duration 430 of the read pulses 415. Further, the durations 420, 430 of write pulses 410 or read pulses 415 of different polarities may be the same or different (e.g., to account for asymmetries in cell behavior).

Timing diagram 400 shows an illustrative example in which read pulses 415 alternate in polarity—that is, each read pulse 415 is of the opposite polarity as the immediately subsequent read pulse. For example, the polarity of read pulse 415-*a* may be negative, the polarity of read pulse 415-*b* may be positive, and the polarity of read pulse 415-*c* may be negative. It is to be understood, however, that read pulses 415 may vary in polarity according to any fixed (e.g., predefined) pattern. And alternatively, in some cases, read pulses 415 may randomly vary (e.g., based on a random number generation algorithm or other randomization component).

The polarity of the read pulse 415 may be controlled (determined) by the memory device or a host device for the memory device. For example, the host device may transmit read commands that may indicate or be associated with (e.g., received concurrently with or according to another timing relative to) an indication of a polarity of the read pulse 415. For example, the read command may include or be associated with a flag or variable that is associated with the polarity and indicates the polarity for the read command. In some such cases, the host device may issue different commands based on which polarity is of read pulse 415 is to be used by the memory device in response to the read command. For example, the host device may issue a read positive command that indicates the memory device is to use a positive polarity for the read pulse 415, or a read negative command that indicates the memory device is to use a negative polarity for the read pulse 415.

In other examples, the memory device may control the polarity of the read pulse 415 via a random number generator or other randomization component associated with the memory device. The memory device may determine a polarity of a read pulse 415 based on the random determination. In some cases, randomly varying the polarity of read pulses 415 as controlled by the memory device may help prevent malicious attacks on the memory device, thereby increasing the security of the device.

And in other examples, the memory device may include a counter or tracker to track the polarity of one or more prior read pulses 415 in order to vary the polarity of the read pulses 415 according to a pattern (e.g., an alternating pattern). In such cases, the memory device may determine a polarity of a read pulse 415 based on the polarity of one or more previous read pulses 415 (e.g., a most recent read pulse 415).

Additionally or alternatively, the memory device may include a counter (e.g., a one (1) bit parity counter) or tracker to track the polarity of one or more prior write pulses 410 and determine a polarity of a read pulse 415 based on the polarity of one or more previous write pulses 410. For example, the polarity of a read pulse 415 may be determined based on the polarity of a most recent write pulse 410. In such cases, the memory device may achieve variation in the polarity of the read pulses 415 based on the varying nature of write data polarity.

Whether controlled by the memory device or a host device, and whether randomized or based on a pattern, the polarity variation of read pulses 415 may be implemented at the device level, the die level, the array level, the sub-array level, or across any other grouping of memory cells. For example, assuming an alternating pattern for the sake of illustration, a read pulse 415 applied to a memory cell may be the opposite polarity of a prior read pulse 415 that was most recently applied to any memory cell within the memory device, to any memory cell within the same die, to any memory cell within the same array, and so on.

Using read pulses 415 of varying polarity may prevent memory cells from drifting towards storing one logic value or another over time due to repeated read pulses of the same polarity. For example, where memory cells written to one logic value may drift over time at a different rate than memory cells written to another logic value, using read pulses 415 of varying polarity may mitigate (e.g., cancel)

such time-based drift, thereby increasing a read window and improving the reliability and accuracy of the memory device. As another example, varying the polarity of the read pulses 415 may improve the bit error rate. One or ordinary skill in the art may apricate these or other benefits.

It is understood timing diagram 400 is just one illustrative example of a sequence of write and read commands and associated write pulses 410 and read pulses 415. Any number of write commands and read command may be received and associated write pulses 410 and read pulses 415 applied to a given memory cell, and in any order.

Figure 5:
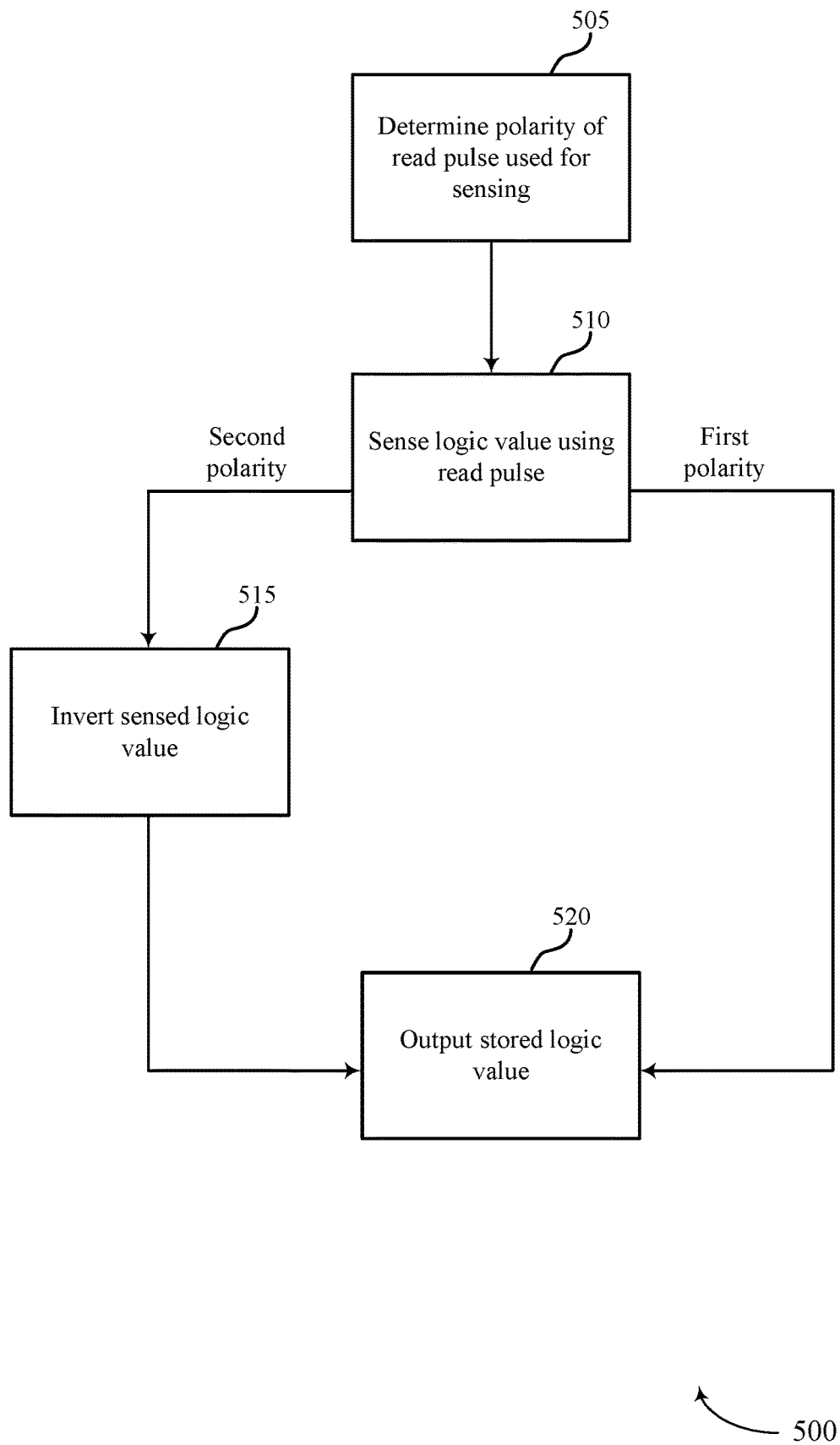
FIG. 5 illustrates an example of a block diagram that supports varying-polarity read operations for polarity-written memory cells in accordance with examples as disclosed herein.

FIG. 5 illustrates an example of a block diagram 500 that supports varying-polarity read operations for polarity-written memory cells in accordance with examples as disclosed herein. The operations of block diagram 500 may be implemented by a memory device or its components as described herein.

At block 505, the memory device may determine the polarity of a read pulse used for sensing. For example, the memory device may determine that the polarity of the read pulse is a first polarity or a second polarity. The memory device may determine the polarity of the read pulse in accordance with the techniques described herein (e.g., autonomously, based on a command or other indication from a host device, randomly, based on a pattern, etc.).

At block 510, the memory device may sense a logic value for the memory cell based on applying the read pulse to the memory cell (e.g., based on determining whether the applied read pulse exceeds a threshold voltage of the memory cell, and thus whether the threshold voltage of the memory cell is high or low). The logic value sensed (identified) at block 510 may be referred to as a sensed logic value.

In some cases, one of the polarities (e.g., either first polarity of second polarity, either the negative or the positive polarity) may be identified (defined) as the "default" read polarity and the other polarity may be identified as the "alternative" or "inverted" read polarity. In such cases, logic values sensed using the default read polarity can be output as-sensed at block 520 (e.g., no need to invert at block 515), but logic values sensed using the alternative read polarity may be inverted at block 515 such that the inverse (opposite) of the sensed logic value may be output at block 520.

In the example of FIG. 5, the first polarity may represent the default read polarity. Thus, for example, if the memory device determines at block 505 that the polarity of the read pulse is the second polarity, the memory device may invert the sensed logic value at block 515, which may counteract the use of the alternative (e.g., inverted, opposite) read polarity. At block 520, the memory device may output the inverted sensed logic value, which may be the stored logic value (e.g., the logic value stored the memory cell by a write pulse 410 most recently applied to the memory cell before the read pulse applied at block 510).

If, however, the memory device determines at block 505 that the polarity of the read pulse is the second polarity, the memory device directly output the sensed logic value at block 520 (e.g., no need for inversion). The sensed logic value may be the stored logic value (e.g., the logic value stored the memory cell by a write pulse 410 most recently applied to the memory cell before the read pulse applied at block 510).

Thus, the memory device may determine the stored logic value output at block 520 based on applying a read voltage (e.g., to determine a sensed threshold voltage and thus a sensed logic value) and based on the polarity of the applied read voltage.

Figure 6:
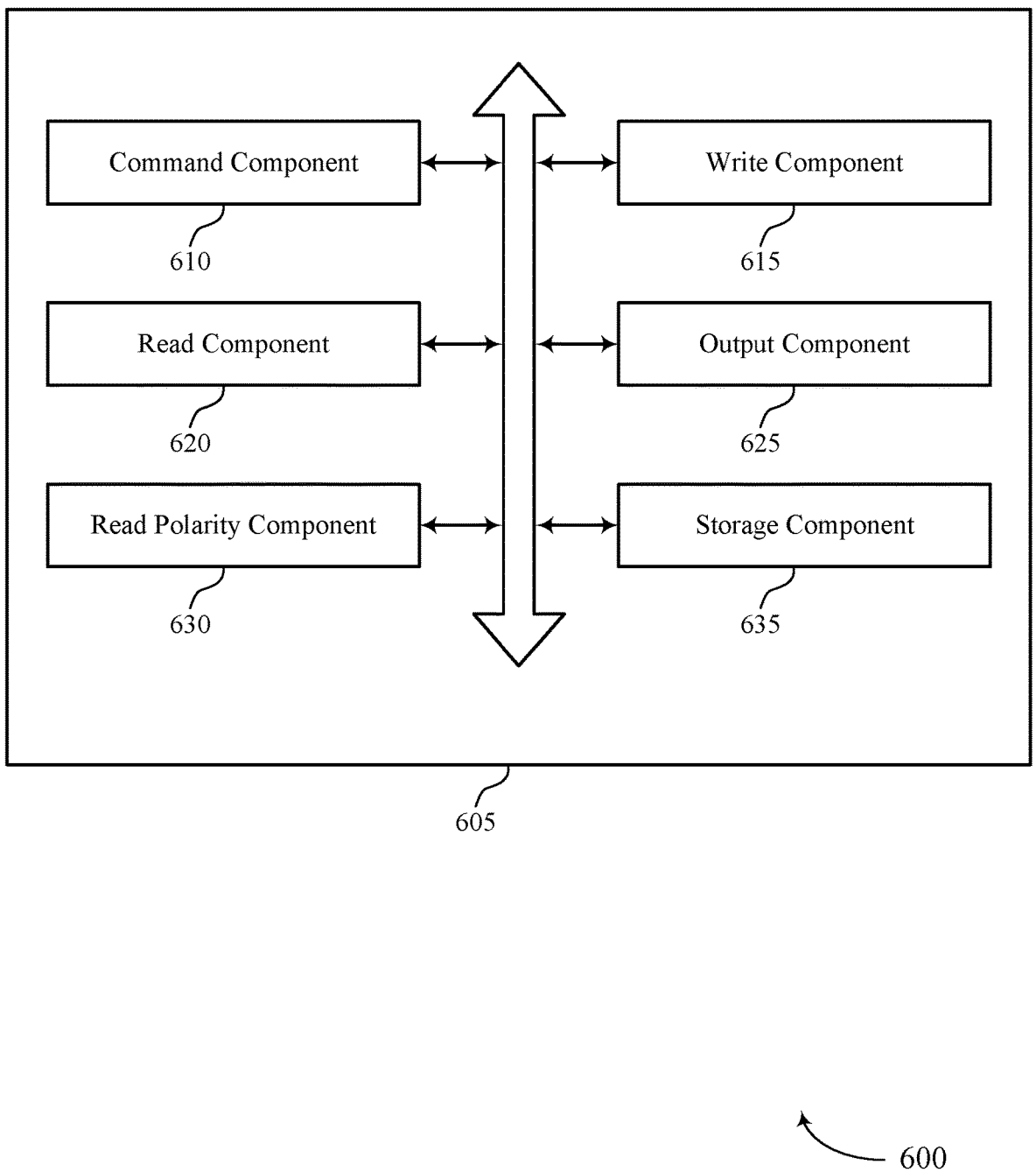
FIG. 6 shows a block diagram of a memory device that supports varying-polarity read operations for polarity-written memory cells in accordance with aspects of the present disclosure.

FIG. 6 shows a block diagram 600 of a memory device 605 that supports varying-polarity read operations for polarity-written memory cells in accordance with examples as disclosed herein. The memory device 605 may be an example of aspects of a memory device as described with reference to FIGS. 1 and 2. The memory device 605 may include a command component 610, a write component 615, a read component 620, an output component 625, a read polarity component 630, and an array component 635. Each of these modules may communicate, directly or indirectly, with one another (e.g., via one or more buses).

In some examples, the command component 610 may receive, at the memory device 605, a first read command for a memory cell. The read component 620 may apply, based at least in part on the first read command, a first read voltage having a first polarity to the memory cell. The command component 610 may receive, after the first read command, a second read command for the memory cell. The read component 620 may apply, based at least in part on the second read command, a second read voltage having a second polarity to the memory cell.

In some examples, the command component 610 may receive, before receiving the first read command, a write command associated with a first logic value for the memory cell. The write component 615 may apply, based on the write command, a write voltage having the first polarity to the memory cell, where the memory cell is operable to store the first logic value based on the write voltage having the first polarity. The read component 620 may determine, in response to the first read command, that the memory cell stores the first logic value based on applying the first read voltage. The read component 620 also may determine, in response to the second read command, that the memory cell stores the first logic value based on applying the second read voltage.

In some examples, the memory cell may be operable to store one of a first logic value or a second logic value, and the read component 620 may sense the second logic value for the memory cell based on applying the second read voltage. In some examples, the output component 625 may output, by the memory device 605, an indication of the first logic value based on the second logic value being sensed and the second read voltage having the second polarity. For example, the read component 620 may determine, after sensing the second logic value, an inverse of the second logic value based on the second read voltage having the second polarity, where the first logic value is the inverse of the second logic value, and where the outputting is based on the determining.

In some examples, the read component 620 may sense the first logic value for the memory cell based on applying the first read voltage. The output component 625 may output, by the memory device 605, an additional indication of the first logic value based on the first logic value being sensed and the first read voltage having the first polarity.

In some examples, the first read command may indicate to use the first polarity for the first read voltage. In some examples, the second read command may indicate to use the second polarity for the second read voltage.

In some examples, the read polarity component 630 may determine to use the first polarity for the first read voltage based on a first random determination. In some examples, the read polarity component 630 may determine to use the second polarity for the second read voltage based on a second random determination.

In some examples, the read polarity component 630 may determine to use the second polarity for the second read voltage based on the first read voltage having the first polarity.

In some examples, the first read voltage and the second read voltage have a same magnitude. In other examples, the first read voltage and the second read voltage have a different magnitude.

In some examples, the storage component 635 may store, at the memory device 605, a set of logic values at a set of memory cells. The command component 610 may receive one or more read commands at the memory device 605. The read component 620 may apply, based on the one or more read commands, a set of read pulses to the set of memory cells, where a first subset of the set read pulses each have a first polarity and a second subset of the set of read pulses each have a second polarity. The output component 625 may transmit, by the memory device 605 and based at least in part applying the set of read pulses, signaling that indicates the stored set of logic values.

In some examples, the read component 620 may sense a set of logic values based on applying the set of read pulses. Each of the stored set of logic values may correspond to a respective sensed logic value. For sensed logic values associated with the first subset of the set of read pulses, the signaling may indicate the respective sensed logic value. For sensed logic values associated with the second subset of the set of read pulses, the signaling may indicate an inverse of the respective sensed logic value.

In some examples, a read pulse of the first subset may be applied after a first read pulse of the second subset and before a second read pulse of the second subset.

In some examples, each of the one or more read commands may be associated with an indication of whether a corresponding one or more of the set of read pulses has the first polarity or the second polarity.

In some examples, for each of the one or more read commands, whether a corresponding one or more of the set of read pulses has the first polarity or the second polarity may be random.

Figure 7:
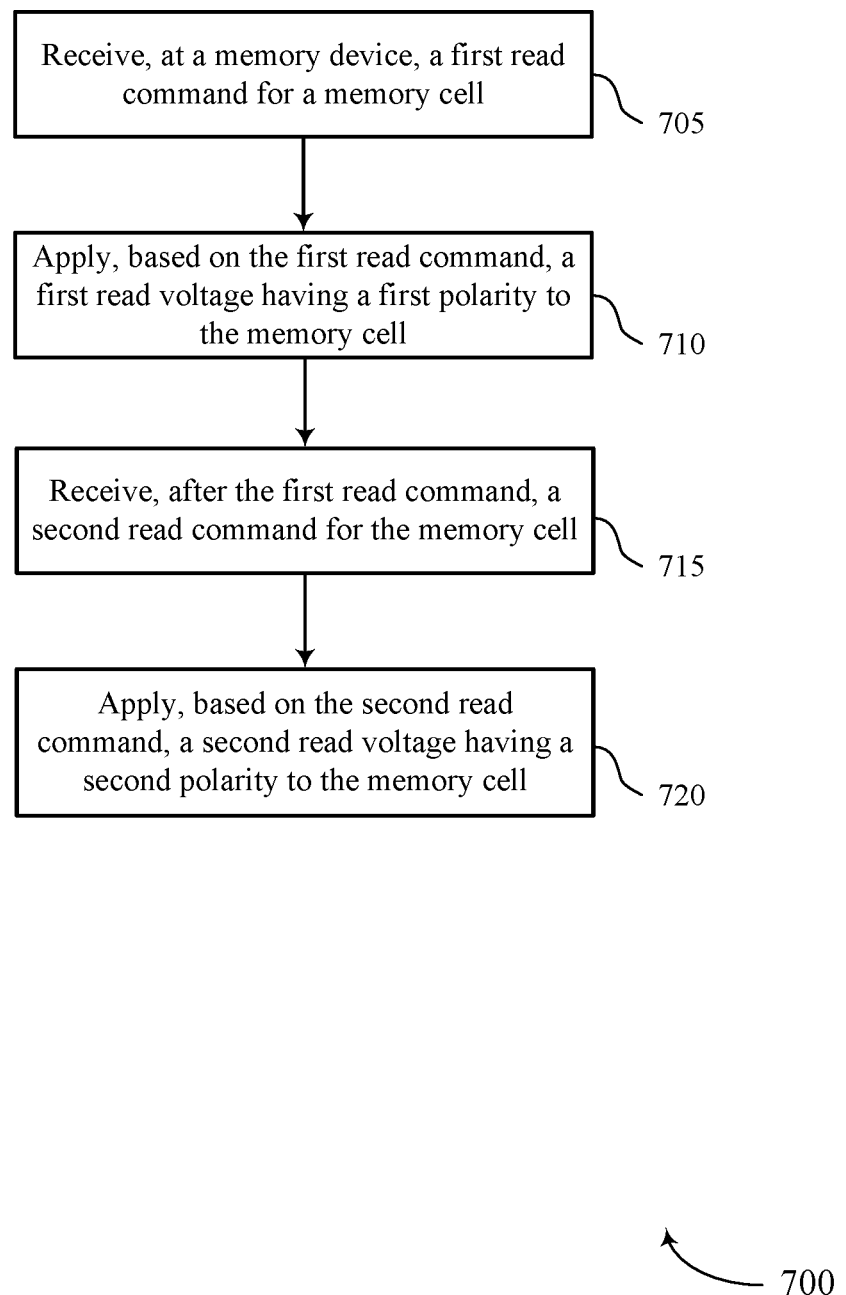
FIGS. 7-9 show flowcharts illustrating a method or methods that support varying-polarity read operations for polarity-written memory cells in accordance with examples as disclosed herein.

FIG. 7 shows a flowchart illustrating a method or methods 700 that supports varying-polarity read operations for polarity-written memory cells in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may receive, at a memory device, a first read command for a memory cell. The operations of 705 may be performed according to the methods described herein. In some examples, aspects of the operations of 705 may be performed by a command component as described with reference to FIG. 6.

At 710, the memory device may apply, based on the first read command, a first read voltage having a first polarity to the memory cell. The operations of 710 may be performed according to the methods described herein. In some examples, aspects of the operations of 710 may be performed by a read component as described with reference to FIG. 6.

At 715, the memory device may receive, after the first read command, a second read command for the memory cell. The operations of 715 may be performed according to the methods described herein. In some examples, aspects of the operations of 815 may be performed by a command component as described with reference to FIG. 6.

At 720, the memory device may apply, based on the second read command, a second read voltage having a second polarity to the memory cell. The operations of 720 may be performed according to the methods described herein. In some examples, aspects of the operations of 720 may be performed by a read component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for receiving, at a memory device, a first read command for a memory cell, applying, based on the first read command, a first read voltage having a first polarity to the memory cell, receiving, after the first read command, a second read command for the memory cell, and applying, based on the second read command, a second read voltage having a second polarity to the memory cell.

Some examples of the method 700 and the apparatus described herein may further include operations, features, means, or instructions for receiving, before receiving the first read command, a write command associated with a first logic value for the memory cell, applying, based on the write command, a write voltage having the first polarity to the memory cell, where the memory cell may be operable to store the first logic value based on the write voltage having the first polarity, determining, in response to the first read command, that the memory cell stores the first logic value based on applying the first read voltage, and determining, in response to the second read command, that the memory cell stores the first logic value based on applying the second read voltage.

In some examples of the method 700 and the apparatus described herein, the memory cell may be operable to store one of a first logic value or a second logic value. Some examples of the method 700 and the apparatus described herein may further include operations, features, means, or instructions for sensing a second logic value for the memory cell based on applying the second read voltage, and outputting, by the memory device, an indication of the first logic value based on the second logic value being sensed and the second read voltage having the second polarity.

Some examples of the method 700 and the apparatus described herein may further include operations, features, means, or instructions for determining, after sensing the second logic value, an inverse of the second logic value based on the second read voltage having the second polarity, where the first logic value may be the inverse of the second logic value, and where the outputting may be based on the determining.

Some examples of the method 700 and the apparatus described herein may further include operations, features, means, or instructions for sensing the first logic value for the memory cell based on applying the first read voltage, and outputting, by the memory device, an additional indication of the first logic value based on the first logic value being sensed and the first read voltage having the first polarity.

In some examples of the method 700 and the apparatus described herein, the first read command indicates to use the first polarity for the first read voltage and the second read command indicates to use the second polarity for the second read voltage.

Some examples of the method 700 and the apparatus described herein may further include operations, features, means, or instructions for determining to use the first polarity for the first read voltage based on a first random determination, and determining to use the second polarity for the second read voltage based on a second random determination.

Some examples of the method 700 and the apparatus described herein may further include operations, features, means, or instructions for determining to use the second polarity for the second read voltage based on the first read voltage having the first polarity.

In some examples of the method 700 and the apparatus described herein, the first read voltage and the second read voltage may have a same magnitude. In some examples of the method 700 and the apparatus described herein, the first read voltage and the second read voltage have a different magnitude.

Figure 8:
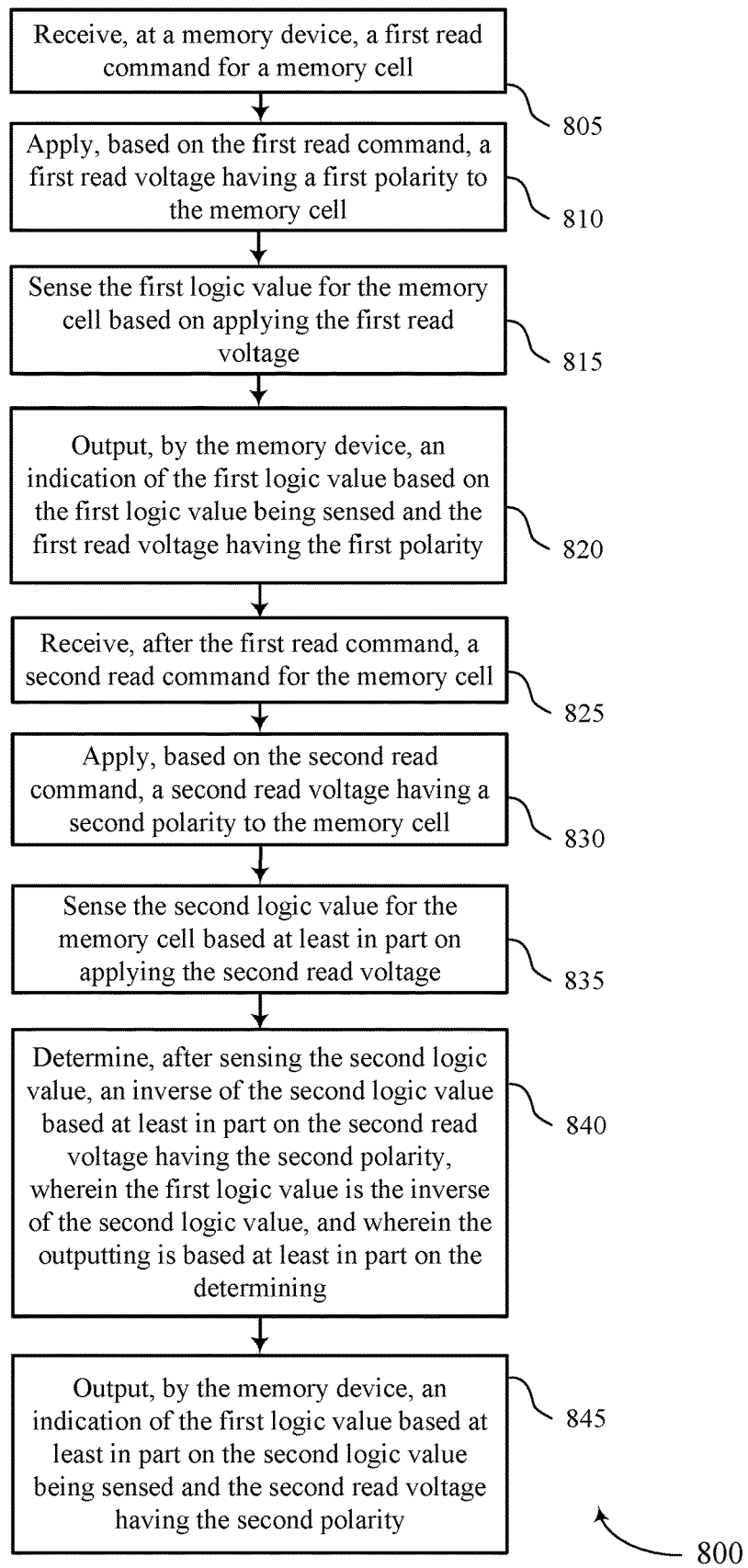

FIG. 8 shows a flowchart illustrating a method or methods 800 that supports varying-polarity read operations for polarity-written memory cells in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may receive, at a memory device, a first read command for a memory cell. The operations of 805 may be performed according to the methods described herein. In some examples, aspects of the operations of 805 may be performed by a command component as described with reference to FIG. 6.

At 810, the memory device may apply, based on the first read command, a first read voltage having a first polarity to the memory cell. The operations of 810 may be performed according to the methods described herein. In some examples, aspects of the operations of 810 may be performed by a read component as described with reference to FIG. 6.

At 815, the memory device may sense the first logic value for the memory cell based on applying the first read voltage. The operations of 815 may be performed according to the methods described herein. In some examples, aspects of the operations of 815 may be performed by a read component as described with reference to FIG. 6.

At 820, the memory device may output, by the memory device, an indication of the first logic value based on the first logic value being sensed and the first read voltage having the first polarity. The operations of 820 may be performed according to the methods described herein. In some examples, aspects of the operations of 820 may be performed by an output component as described with reference to FIG. 6.

At 825, the memory device may receive, after the first read command, a second read command for the memory cell. The operations of 825 may be performed according to the methods described herein. In some examples, aspects of the operations of 825 may be performed by a command component as described with reference to FIG. 6.

At 830, the memory device may apply, based on the second read command, a second read voltage having a second polarity to the memory cell. The operations of 830 may be performed according to the methods described herein. In some examples, aspects of the operations of 830 may be performed by a read component as described with reference to FIG. 6.

At 835, the memory device may sense the second logic value for the memory cell based at least in part on applying the second read voltage. The operations of 835 may be performed according to the methods described herein. In some examples, aspects of the operations of 835 may be performed by a read component as described with reference to FIG. 6.

At 840, the memory device may determine, after sensing the second logic value, an inverse of the second logic value based at least in part on the second read voltage having the second polarity, wherein the first logic value is the inverse of the second logic value, and wherein the outputting is based at least in part on the determining. The operations of 840 may be performed according to the methods described herein. In some examples, aspects of the operations of 845 may be performed by a read component as described with reference to FIG. 6.

At 845, the memory device may output, by the memory device, an indication (e.g., a second indication, an additional indication) of the first logic value based at least in part on the second logic value being sensed and the second read voltage having the second polarity. The operations of 840 may be performed according to the methods described herein. In some examples, aspects of the operations of 840 may be performed by an output component as described with reference to FIG. 6.

Figure 9:
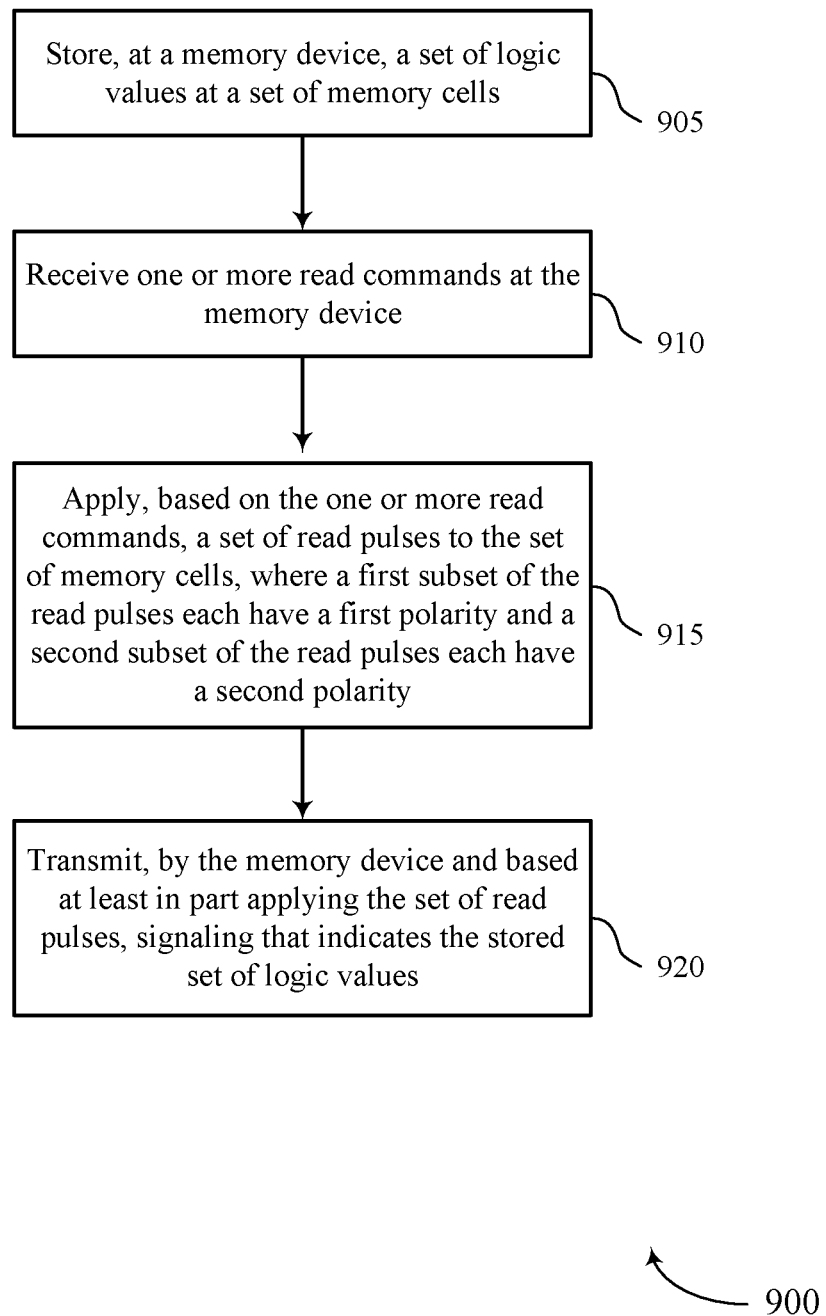

FIG. 9 shows a flowchart illustrating a method or methods 900 that supports varying-polarity read operations for polarity-written memory cells in accordance with aspects of the present disclosure. The operations of method 900 may be implemented by a memory device or its components as described herein. For example, the operations of method 900 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 905, the memory device may store, at a memory device, a set of logic values at a set of memory cells. The operations of 905 may be performed according to the methods described herein. In some examples, aspects of the operations of 905 may be performed by a storage component as described with reference to FIG. 6.

At 910, the memory device may receive one or more read commands at the memory device. The operations of 910 may be performed according to the methods described herein. In some examples, aspects of the operations of 910 may be performed by a command component as described with reference to FIG. 6.

At 915, the memory device may apply, based on the one or more read commands, a set of read pulses to the set of memory cells, where a first subset of the set of read pulses each have a first polarity and a second subset of the set of read pulses each have a second polarity. The operations of 915 may be performed according to the methods described herein. In some examples, aspects of the operations of 915 may be performed by a read component as described with reference to FIG. 6.

At 920, the memory device may transmit, by the memory device and based at least in part applying the set of read pulses, signaling that indicates the stored set of logic values. The operations of 920 may be performed according to the methods described herein. In some examples, aspects of the operations of 920 may be performed by an output component as described with reference to FIG. 6.

In some examples, an apparatus as described herein may perform a method or methods, such as the method 900. The apparatus may include features, means, or instructions (e.g., a non-transitory computer-readable medium storing instructions executable by a processor) for storing, at a memory device, a set of logic values at a set of memory cells, receiving one or more read commands at the memory device, applying, based on the one or more read commands, a set of read pulses to the set of memory cells, where a first subset of the set of read pulses each have a first polarity and a second subset of the set of read pulses each have a second polarity, and transmitting, by the memory device and based at least in part applying the set of read pulses, signaling that indicates the stored set of logic values.

Some examples of the method 900 and the apparatus described herein may further include operations, features, means, or instructions for sensing a set of logic values based on applying the set of read pulses, each of the stored set of logic values corresponding to a respective sensed logic value, where for sensed logic values associated with the first subset of the set of read pulses, the signaling indicates the respective sensed logic value, and for sensed logic values associated with the second subset of the read pulses, the signaling indicates an inverse of the respective sensed logic value.

In some examples of the method 900 and the apparatus described herein, a read pulse of the first subset may be applied after a first read pulse of the second subset and before a second read pulse of the second subset.

In some examples of the method 900 and the apparatus described herein, each of the one or more read commands may be associated with an indication of whether a corresponding one or more of the set of read pulses may have the first polarity or the second polarity. In some examples of the method 900 and the apparatus described herein, for each of the one or more read commands, whether a corresponding one or more of the set of read pulses may have the first polarity or the second polarity may be random.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an array of memory cells and an access component coupled with the array of memory cells. The access component may be operable to apply a write voltage to a memory cell of the array in response to a write command for the memory cell, where the memory cell is operable to store a logic value based on a polarity of the write voltage, apply a read voltage to the memory cell in response to a read command for the memory cell. The apparatus may further include a sense component coupled with the array of memory cells and operable to sense whether the read voltage exceeds a threshold voltage of the memory cell and generate an indication of the stored logic value based on whether the read voltage exceeds the threshold voltage of the memory cell and a polarity of the read voltage.

In some examples, the access component may be operable to determine the polarity of the read voltage based on an indication associated with the read command. In some examples, the access component may be operable to randomly vary the polarity of the read voltage. In some examples, the access component may be operable to determine the polarity of the read voltage based on a polarity of a prior read voltage. In some examples, the access component may be operable to determine the polarity of the read voltage based on a polarity of a prior write voltage.

In some examples, the sense component may be operable to identify a sensed logic value for the memory cell based on whether the read voltage exceeds the threshold voltage of the memory cell and selectively invert the sensed logic value based on the polarity of the read voltage.

In some examples, the memory cell may be operable to store one of a first logic value or a second logic value, and the sense component may be operable to identify the stored logic value as the first logic value if the read voltage exceeds the threshold voltage of the memory cell and the polarity of the read voltage is a first polarity, identify the stored logic value as the second logic value if the read voltage is below the threshold voltage of the memory cell and the polarity of the read voltage is the first polarity, identify the stored logic value as the second logic value if the read voltage exceeds the threshold voltage of the memory cell and the polarity of the read voltage is a second polarity, and identify the stored logic value as the first logic value if the read voltage is below the threshold voltage of the memory cell and the polarity of the read voltage is the second polarity.

In some examples, the sense component may be operable to determine whether the read voltage exceeds the threshold voltage of the memory cell based on an amount of current through the memory cell while the read voltage is applied to the memory cell.

In some examples, the sense component may be operable to determine whether the read voltage exceeds the threshold voltage of the memory cell based on whether a snapback event occurs while the read voltage may be applied to the memory cell.

In some examples, the threshold voltage of the memory cell may be based on whether the polarity of the read voltage and the polarity of the write voltage are the same. In some examples, the memory cell may be operable to have a first threshold voltage if the polarity of the read voltage and the polarity of the write voltage are the same and a second threshold voltage if the polarity of the read voltage and the polarity of the write voltage are different. The read voltage may have a magnitude that may be greater than the first threshold voltage and less than the second threshold voltage.

In some examples, the memory cell includes a chalcogenide material that may be operable to store a first logic value while in an amorphous state if the polarity of the write voltage is a first polarity and operable to store a second logic value while in the amorphous state if the polarity of the write voltage is a second polarity.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

As used herein, the term "substantially" or "substantial" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   an array of memory cells;
   an access component coupled with the array of memory cells and operable to:
      apply a write voltage to a memory cell of the array in response to a write command for the memory cell, wherein the memory cell is operable to store a logic value based at least in part on a polarity of the write voltage; and
      apply a read voltage to the memory cell in response to a read command for the memory cell; and
   a sense component coupled with the array of memory cells and operable to;
      identify a sensed logic value for the memory cell based at least in part on whether the read voltage exceeds a threshold voltage of the memory cell;
      determine whether to invert the sensed logic value based at least in part on a polarity of the read voltage relative to a polarity of a default read voltage; and
      generate an indication of the stored logic value based at least in part on determining whether to invert the sensed logic value.

2. The apparatus of claim 1, wherein the access component is operable to determine the polarity of the read voltage based at least in part on an indication associated with the read command.

3. The apparatus of claim 1, wherein the access component is operable to randomly vary the polarity of the read voltage.

4. The apparatus of claim 1, wherein the access component is operable to determine the polarity of the read voltage based at least in part on a polarity of a prior read voltage.

5. The apparatus of claim 1, wherein the access component is operable to determine the polarity of the read voltage based at least in part on a polarity of a prior write voltage.

6. The apparatus of claim 1, wherein:
   the memory cell is operable to store one of a first logic value or a second logic value; and
   the sense component is operable to:
      identify the stored logic value as the first logic value if the read voltage exceeds the threshold voltage of the memory cell and the polarity of the read voltage is a first polarity;
      identify the stored logic value as the second logic value if the read voltage is below the threshold voltage of the memory cell and the polarity of the read voltage is the first polarity;
      identify the stored logic value as the second logic value if the read voltage exceeds the threshold voltage of the memory cell and the polarity of the read voltage is a second polarity; and
      identify the stored logic value as the first logic value if the read voltage is below the threshold voltage of the memory cell and the polarity of the read voltage is the second polarity.

7. The apparatus of claim 1, wherein the sense component is operable to:
   determine whether the read voltage exceeds the threshold voltage of the memory cell based at least in part on an amount of current through the memory cell while the read voltage is applied to the memory cell.

8. The apparatus of claim 1, wherein the sense component is operable to:
   determine whether the read voltage exceeds the threshold voltage of the memory cell based at least in part on whether a snapback event occurs while the read voltage is applied to the memory cell.

9. The apparatus of claim 1, wherein the threshold voltage of the memory cell is based at least in part on whether the polarity of the read voltage and the polarity of the write voltage are the same.

10. The apparatus of claim 9, wherein:
    the memory cell is operable to have a first threshold voltage if the polarity of the read voltage and the polarity of the write voltage are the same and a second threshold voltage if the polarity of the read voltage and the polarity of the write voltage are different; and the read voltage has a magnitude that is greater than the first threshold voltage and less than the second threshold voltage.

11. The apparatus of claim 1, wherein:
the memory cell comprises a chalcogenide material that is operable to store a first logic value while in an amorphous state if the polarity of the write voltage is a first polarity and operable to store a second logic value while in the amorphous state if the polarity of the write voltage is a second polarity.

12. A method, comprising:
applying, via an access component coupled with an array of memory cells, a write voltage to a memory cell of the array in response to a write command for the memory cell, wherein the memory cell is operable to store a logic value based at least in part on a polarity of the write voltage;
applying, via the access component, a read voltage to the memory cell in response to a read command for the memory cell;
identifying, via a sense component coupled with the array of memory cells, a sensed logic value for the memory cell based at least in part on whether the read voltage exceeds a threshold voltage of the memory cell;
determining whether to invert the sensed logic value based at least in part on a polarity of the read voltage relative to a polarity of a default read voltage; and
generating, via the sense component, an indication of the stored logic value based at least in part on determining whether to invert the sensed logic value.

13. The method of claim 12, further comprising:
determining, via the access component, the polarity of the read voltage based at least in part on an indication associated with the read command.

14. The method of claim 12, further comprising:
randomly varying, via the access component, the polarity of the read voltage.

15. The method of claim 12, further comprising:
determining, via the access component, the polarity of the read voltage based at least in part on a polarity of a prior read voltage.

16. The method of claim 12, further comprising:
determining, via the access component, the polarity of the read voltage based at least in part on a polarity of a prior write voltage.

17. The method of claim 12, wherein the memory cell is operable to store one of a first logic value or a second logic value, the method further comprising:
identifying, via the sense component, the stored logic value as the first logic value if the read voltage exceeds the threshold voltage of the memory cell and the polarity of the read voltage is a first polarity;
identifying, via the sense component, the stored logic value as the second logic value if the read voltage is below the threshold voltage of the memory cell and the polarity of the read voltage is the first polarity;
identifying, via the sense component, the stored logic value as the second logic value if the read voltage exceeds the threshold voltage of the memory cell and the polarity of the read voltage is a second polarity; and
identifying, via the sense component, the stored logic value as the first logic value if the read voltage is below the threshold voltage of the memory cell and the polarity of the read voltage is the second polarity.

18. A non-transitory computer-readable medium storing code comprising instructions which, when executed by a processor of an electronic device, cause the electronic device to:
apply, via an access component coupled with an array of memory cells, a write voltage to a memory cell of the array in response to a write command for the memory cell, wherein the memory cell is operable to store a logic value based at least in part on a polarity of the write voltage;
apply, via the access component, a read voltage to the memory cell in response to a read command for the memory cell;
via a sense component coupled with the array of memory cells, a sensed logic value for the memory cells based at least in part on whether the read voltage exceeds a threshold voltage of the memory cell;
determine whether to invert the sensed logic value based at least in part on a polarity of the read voltage relative to a polarity of a default read voltage; and
generate, via the sense component, an indication of the stored logic value based at least in part on determining whether to invert the sensed logic value.

* * * * *